United States Patent [19]
Fujii

[11] Patent Number: 5,138,578
[45] Date of Patent: Aug. 11, 1992

[54] SEMICONDUCTOR MEMORY CIRCUIT HAVING AN IMPROVED RESTORING SCHEME

[75] Inventor: Takeo Fujii, Tokyo, Japan

[73] Assignee: NEC Corporation, Tokyo, Japan

[21] Appl. No.: 735,780

[22] Filed: Jul. 29, 1991

Related U.S. Application Data

[63] Continuation of Ser. No. 271,790, Nov. 16, 1988, abandoned.

[30] Foreign Application Priority Data

Nov. 17, 1987 [JP] Japan .................................. 62-291138

[51] Int. Cl.[5] ............................................ G11C 7/00
[52] U.S. Cl. .................................. 365/203; 365/149; 365/205; 365/222
[58] Field of Search ............... 365/149, 205, 207, 210, 365/222, 203

[56] References Cited

U.S. PATENT DOCUMENTS

| | | | |
|---|---|---|---|
| 4,584,672 | 4/1986 | Schutz et al. | 365/205 |
| 4,656,613 | 4/1987 | Norwood et al. | 365/210 |

FOREIGN PATENT DOCUMENTS

| | | |
|---|---|---|
| 0037252 | 10/1981 | European Pat. Off. . |
| 0185572 | 6/1986 | European Pat. Off. . |
| 0240155 | 10/1987 | European Pat. Off. . |
| 86/07183 | 12/1986 | PCT Int'l Appl. . |

Primary Examiner—Joseph A. Popek
Attorney, Agent, or Firm—Sughrue, Mion, Zinn, Macpeak & Seas

[57] ABSTRACT

A dynamic memory circuit which can operate at a high speed and with a reduced amount of current noise is disclosed. The memory circuit includes dynamic type memory cells which necessitate restoring operation for rewritting read out data thereto, a read circuit for performing a read out operation in response to an active level of an externally supplied control signal and a restore circuit for performing the restoring operation in response to change of the externally supplied control signal to its inactive level.

13 Claims, 8 Drawing Sheets

SEMICONDUCTOR MEMORY CIRCUIT HAVING AN IMPROVED RESTORING SCHEME

This is a continuation of application Ser. No. 07/271,790 filed Nov. 16, 1988, now abandoned.

BACKGROUND OF THE INVENTION

1. Field of the Invention

The present invention relates to a semiconductor memory circuit and, more particularly to a dynamic type random access memory (DRAM) fabricated on a semiconductor substrate.

2. Description of the Related Art

Dynamic memory circuits have been widely utilized as large capacity semiconductor memories. The dynamic memory circuit is typically constructed in such a manner that one-transistor type memory cells each composed of one transistor and a capacitor are arranged in a matrix form of rows and columns together with word lines and bit lines arranged in rows and columns, respectively.

According to the conventional techniques, the number of memory cells connected to one bit line increases as the memory capacity increases. Consequently, a stray capacitance of each bit line increases to give rise to various problems. Firstly, the increased stray capacitance increases the time required to charge the bit lines to a power source potential Vcc or to discharge them to a ground potential when sense amplifiers are activated. If the signals on the bit lines are not amplified sufficiently, i.e., if the charging or discharging thereof are not done sufficiently, it becomes impossible to activate a column selection circuit which connects a selected bit line to a common data line because there is the possibility that, when the common data line is connected to the bit line, the electric charge on the common data line enters the bit line to destroy the stored information. As a result, the outputting of data from an output terminal has to be delayed in order to sufficiently charge or discharge the bit lines, and the operation speed of the memory becomes inferior. Secondary, the increased capacitance of the bit lines causes an increase of the charging and discharging currents, which gives rise to the problems of, for example, the floating of the grounding potential, dropping of the power source potential, occurrence of noise between the bit lines and an increase of the power consumption.

SUMMARY OF THE INVENTION

It is an object of the present invention to provide a dynamic memory which can operate at a high speed.

It is another object of the present invention to provide a dynamic memory in which a peak current caused by restoring data to memory cells is decreased.

The dynamic memory according to the present invention comprises means for receiving an external control signal having a first level which sets the memory in an active state and a second level which sets the memory in a reset state and dynamic memory cells which require restoring read-out data thereto and is featured in that read-out of data from memory cell or cells is performed in the active state and restoring of data to the memory cell or cells is conducted in the reset state.

According to this feature, a time required for the restoring of data to the memory cells is removed in the active state of the memory and therefore an effective period of the active state can be shortened and a current amount required in the active state is reduced.

According to a preferred aspect of the present invention, there is provided a dynamic memory comprising means for receiving an external control signal, word lines, bit lines, dynamic memory cells coupled to the word lines and bit lines, sense amplifiers having sense nodes, transfer gates electrically inserted between the bit lines and the sense nodes of the sense amplifiers, means for selecting one of the word lines, and a control circuit responsive to the external signal for controlling the selecting means, the sense amplifiers and the transfer gates. The control circuit enables the selecting means first when the external control signal assumes an active level and then temporarily enabling the transfer gates under the active level of the external control signal. Then, after the transfer gates are disenabled, the sense amplifiers are enabled by the control circuit under the active level of the external control signal. After the external control signal assumes an inactive level, the selecting means and the sense amplifiers have been maintained active for a predetermined period and the transfer gates are again enabled within the above predetermined period to restore read-out data into memory cells.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Prior Art

Figure 1:
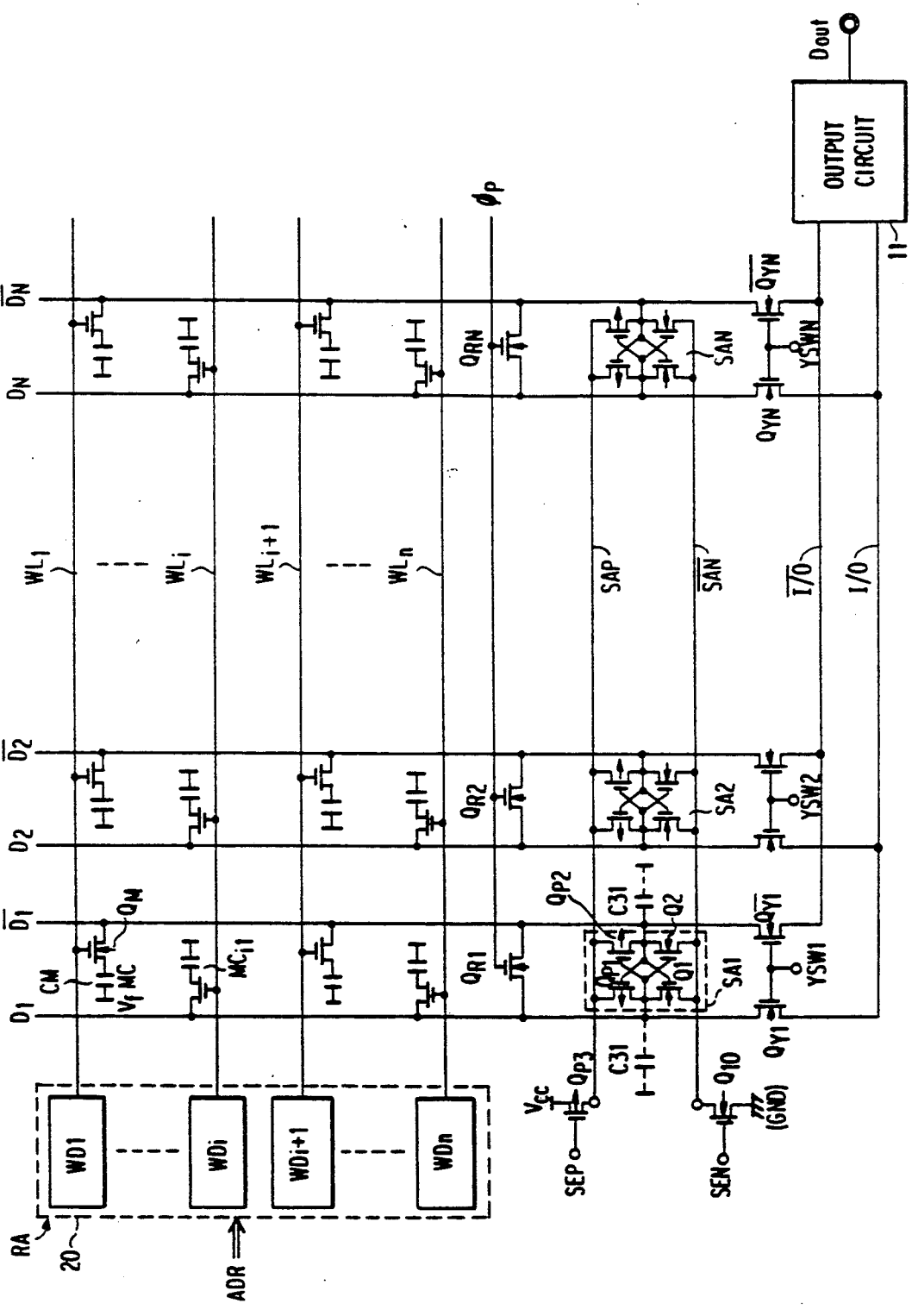
FIG. 1 is a schematic circuit diagram showing a dynamic memory in the prior art.
Figure 2:
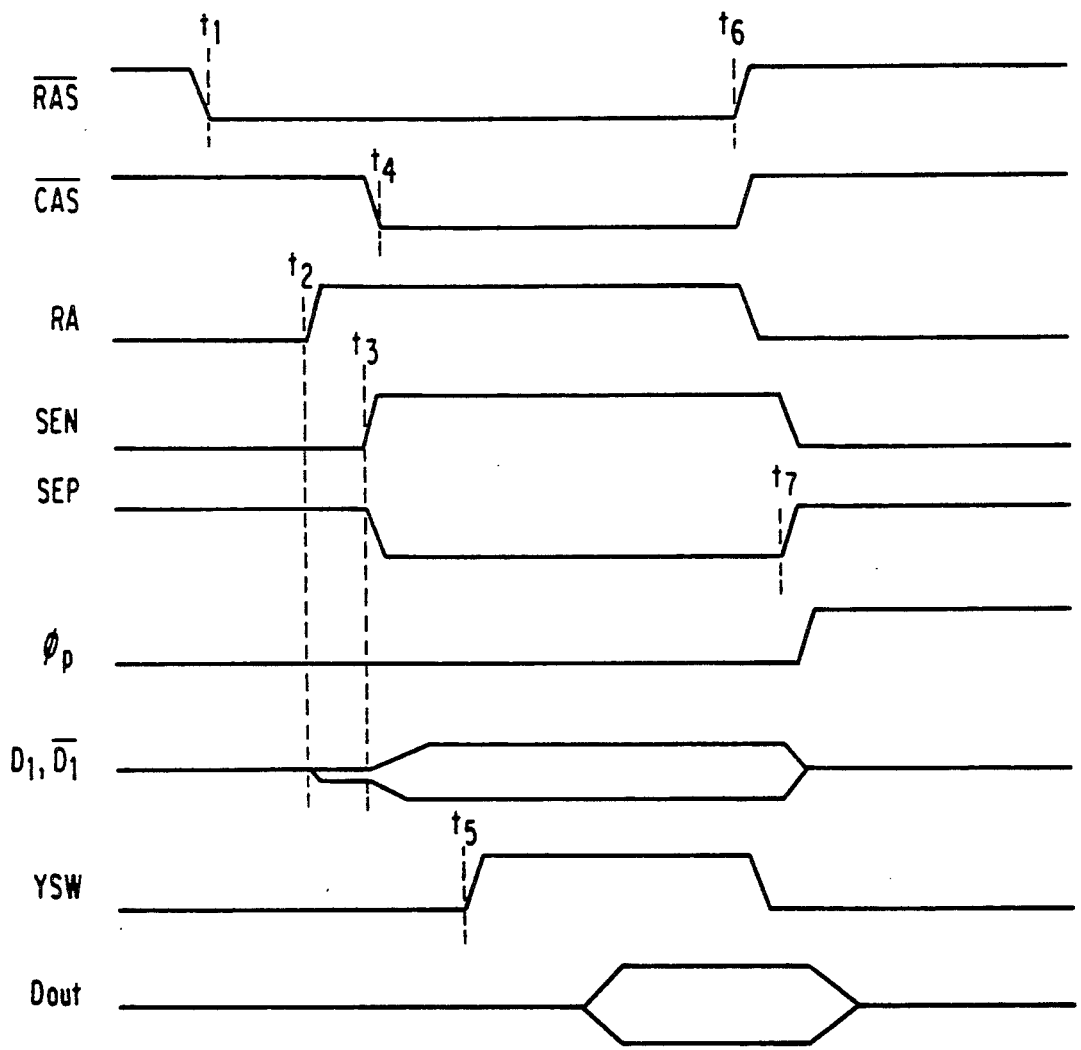
FIG. 2 is a timing diagram showing an operation of the memory of FIG. 1.

With reference to FIGS. 1 and 2, a typical structure of the conventional dynamic memory will be explained. As shown in FIG. 1, the memory comprises a plurality of memory cells MC each having a memory cell transistor $Q_M$ and a capacitor $C_M$ connected between the transistor $Q_M$ and a fixed potential $V_f$, word lines $WL_1$ $-WL_n$ arranged in rows, a plurality of bit line pairs $D_1$, $\overline{D_1}$-$D_N$, $\overline{D_N}$ arranged in columns, a CMOS type sense amplifiers $SA_1$-$SA_N$ provided for the bit line pairs $D_1$, $\overline{D_1}$-$D_N$, $\overline{D_N}$, respectively, a pair of common data lines I/O, $\overline{I/O}$, a plurality of pairs of column selection transistors $QY_1$, $\overline{QY_1}$-$QY_N$, $\overline{QY_N}$ connected between the bit line pairs $D_1$, $\overline{D_1}$-$D_N$, $\overline{D_N}$ and the pair of common data lines I/O, $\overline{I/O}$, respectively, a row decoder 20 having decoding units $WD_1$-$WD_n$ for the word lines $WL_1$-$WL_n$, respectively and an output circuit 11.

The row decoder 20 receives row address signals ADR and selects one of the word lines $WL_1$-$WL_n$ in response to a control signal RA. Each of the sense amplifiers $SA_1$-$SA_N$ includes P-channel MOS transistors $QP_1$, $QP_2$ and N-channel MOS transistors $Q_1$, $Q_2$, and is connected to a first activation line SAP which is coupled to a P-channel MOS transistor $QP_3$ controlled by a control signal SEP and a second activation line $\overline{SAN}$ connected to an N-channel MOS transistor $Q_{10}$ receiving a control signal SEN. The pairs of column selection transistors $QY_1$, $\overline{QY_1}$, $QY_N$-$\overline{QY_N}$ are controlled by column decoder signals $YSW_1$-$YSW_N$ respectively in a known way.

The typical operation waveforms of the semiconductor memory shown in FIG. 1 are illustrated in FIG. 2. Before an active operation has been started, the bit lines $D_1$, $\overline{D_1}$-$D_N$, $\overline{D_N}$ are precharged at, for example, an intermediate electric potential ($\frac{1}{2}$ Vcc) between the power source potential Vcc and the grounding potential GND. After a row address strobe signal $\overline{RAS}$ becomes active (low) level at a time point $t_1$, one of the word decoding units $WD_1$-$WD_n$, for example, WDi is selected by the row address signal ADR received from the outside. When the control signal RA, which is internally produced from $\overline{RAS}$, rises at $t_2$, the word line WLi moves up, and N-MOS transistors in the memory cells MC are turned on, so that the electric potentials in the bit lines $D_1$-$D_N$ vary by approximately 200 mV in accordance with the electric charge stored in the memory cell capacitors. In the meantime, the electric potentials in the bit lines $\overline{D_1}$-$\overline{D_N}$ remain in the initial precharge level, i.e. $\frac{1}{2}$ Vcc, and a signal representative of a difference between these electric potentials turns into input signals for the sense amplifiers $SA_1$-$SA_N$. When the control signals SEN rises with SEP falling at $t_3$, the sense amplifiers $SA_1$-$SA_N$ are activated, and the small differential signals inputted into the sense amplifiers are amplified. Consequently, for example, the bit line $D_1$ drops to the ground potential, and the bit line $\overline{D_1}$ rises to the power source potential Vcc. (in the case where a low level is stored in the memory cell $MC_{i1}$). In practice, when the word line WLi rises with the information read out on the bit line $D_1$; the information in the capacitor CM in the memory cell $MC_{i1}$ is destroyed by the exchange of electric charge between the capacitor CM thereof and the bit line $D_1$. Therefore, the sense amplifiers have the functions of amplifying the small signals on the bit lines $D_1$, $\overline{D_1}$ as well as restoring the information (called "refreshing") in the memory cell as compensation for the destraction of information. After a column address strobe signal $\overline{CAS}$ then becomes active (low) level, one of the column decoder signals $YSW_1$-$YSW_N$ is selected at $t_5$. For example, $YSW_1$ is selected and rises, so that the data on the bit lines $D_1$, $\overline{D_1}$ are transferred to the common data lines I/O, $\overline{I/O}$. The transferred data are amplified by the output circuit 11 and outputted to an output terminal Dout. When $\overline{RAS}$ becomes inactive (high level) at $t_6$, the memory enters into a reset period and a precharge signal $\phi_p$ becomes active so that precharge transistors $QR_1$-$QR_N$ are rendered conductive at $t_7$.

According to the above conventional techniques, the number of memory cells connected to one bit line increases as the memory capacity increases. Consequently, a stray capacitance $C_{31}$ of the respective bit lines increases to give rise to various problems. Firstly, the increased stray capacitance $C_{31}$ increases the time required to charge the bit lines $D_1$-$D_N$, $\overline{D_1}$-$\overline{D_N}$ to the power source potential Vcc or to discharge them to the ground potential when the sense amplifiers are activated as mentioned above. If the signals on the bit line pairs $D_1$, $\overline{D_1}$-$D_N$, $\overline{D_N}$ are not amplified sufficiently, i.e., if the charging and discharging thereof are not done sufficiently, it becomes impossible to activate YSWi and connect the bit lines to the common data lines I/O, $\overline{I/O}$ because there is the possibility that, when the common data lines are connected to the bit lines, the electric charge in the common data lines enters the bit lines to destroy the information. As a result, the outputting of data from the output terminal Dout is delayed, and the operation speed of the memory becomes inferior. Secondly, the increased capacitance $C_{31}$ causes an increase of the charging and discharging currents, which gives rise to the problems of, for example, the floating of the grounding potential, dropping of the power source potential, occurrence of noise between the bit lines and an increase of the power conumpstion.

EMBODIMENTS OF THE INVENTION

Figure 3:
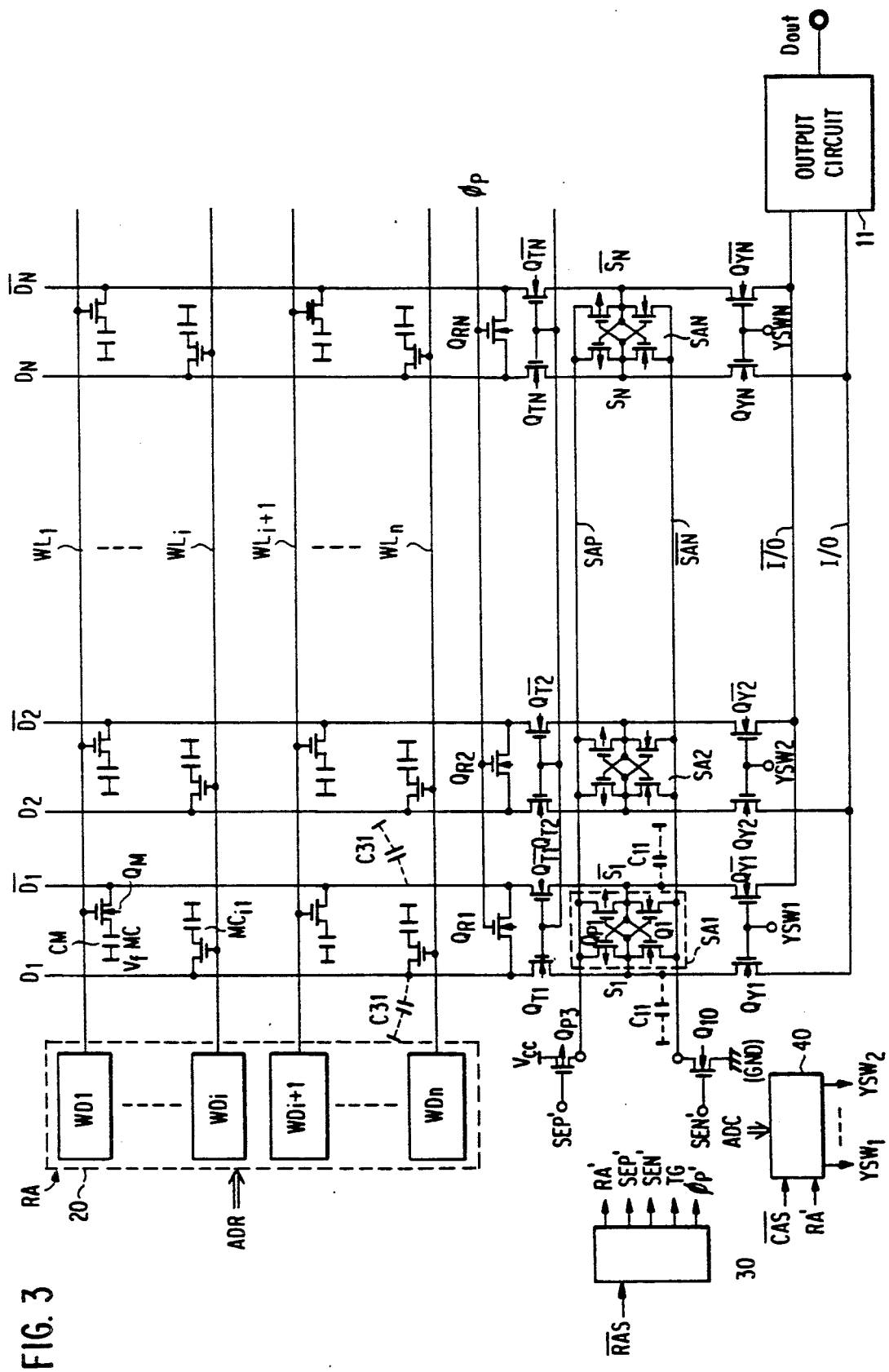
FIG. 3 is a schematic circuit diagram of a dynamic memory according to a first embodiment of the present invention.
Figure 4:
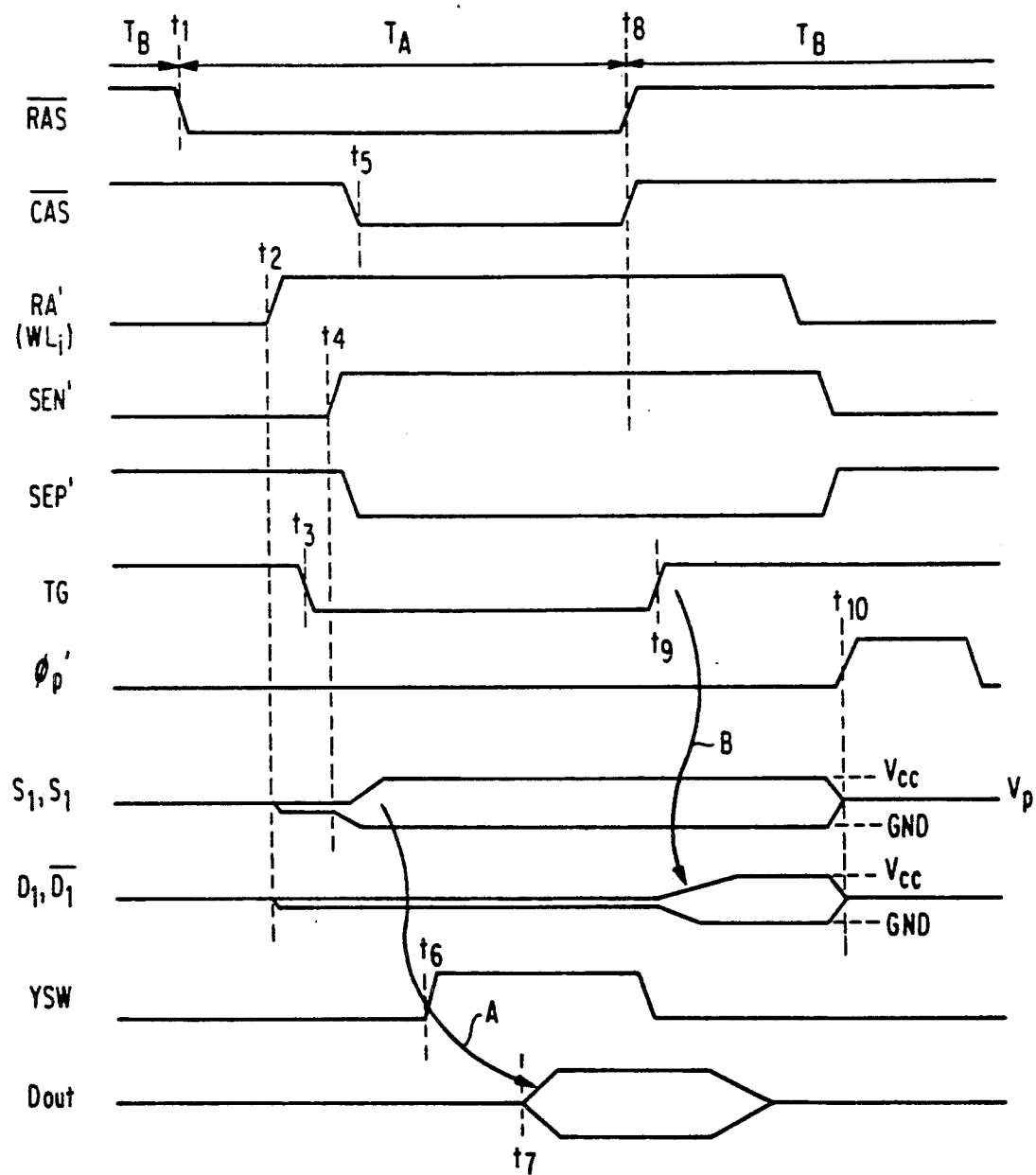
FIG. 4 is a timing diagram showing an operation of the memory of FIG. 3.

With reference to FIGS. 3 and 4, the dynamic memory according to one embodiment of the present invention will be explained. In FIGS. 3 and 4, elements or portions corresponding to those in FIGS. 1 and 2 are denoted by the same or similar references.

The memory of the present invention is featured by following two points.

The first point is that a plurality of pairs of transfer gate (N-channel) transistors $QT_1$, $\overline{QT_1}$-$QT_N$, $\overline{QT_N}$ are inserted between the pairs of bit lines $D_1$, $\overline{D_1}$-$D_N$, $\overline{D_N}$ and a plurality of pairs of sense nodes $S_1$, $\overline{S_1}$-$S_N$, $\overline{S_N}$ of the sense amplifiers $SA_1$-$SA_N$, respectively. The purpose of providing these transfer gates transistors is to separate the stray capacitance $C_{31}$ of the bit lines and that $C_{11}$ of sense nodes $S_1$-$S_N$ from each other when the sense amplifiers are activated so as to increase the operating speed of the sense amplifiers, as explained later.

The second point is that a restoring operation is conducted during a reset period when $\overline{RAS}$ is made inactive under control of the control signals RA', SEP', SEN', TG and $\phi_p'$ generated by a timing signal generator 30. A column control circuit 40 generates the signal $YSW_1$-$YSW_N$ in accordance with column address signals ADC under control of a column strobe signal $\overline{CAS}$ and RA'.

The operation of the memory of FIG. 3 will be explained with reference to FIG. 4.

Prior to a time point $t_1$, a reset period has been introduced and the pairs of bit lines $D_1$, $\overline{D_1}$-$D_N$, $\overline{D_N}$ and the sense nodes $S_1$, $\overline{S_1}$-$S_N$, $\overline{S_N}$ have been precharged to a precharge potential Vp (e.g. $\frac{1}{2}$ Vcc). At the time point $t_1$, the row strobe signal $\overline{RAS}$ is changed to the active level so that the active period TA is introduced into the memory. In response to the activation of $\overline{RAS}$, the row address signals ADR are taken in and applied to the row decoder 20. Then at a time point $t_2$, the control signal RA' is activated so that one word line, for example, WLi is then selected by the row decoding unit WDi of the decoder 20 on the basis of row address signals ADR. When the electric potential of the selected word line WLi rises, the stored information in the memory cells MC connected to the selected word line WLi appear in the form of small signals in bit line pairs $D_1$, $\overline{D_1}$-$D_N$, $\overline{D_N}$, respectively. Since the electric potential of a transfer gate control signal TG is high at this time, the signals on the bit line pairs $D_1$, $\overline{D_1}$-$D_N$, $\overline{D_N}$ are transferred to sense nodes $S_1$, $\overline{S_1}$-$S_N$, $\overline{S_N}$, respectively. The control signal TG is then lowered at a time point $t_3$ to turn off the transfer gates $QT_1$, $\overline{QT_1}$-$QT_N$, $\overline{QT_N}$, and the bit lines $D_1$, $\overline{D_1}$-$D_N$, $\overline{D_N}$ and the sense nodes $S_1$, $\overline{S_1}$-$S_N$, $\overline{S_N}$ are electrically separated from each other.

Then, at a time point $t_4$, the control signal SEN' is raised to lower the line $\overline{SAN}$ via the transistor $Q_{10}$ and thereafter the control signal SEP' is lowered to raise the line SAP so that the sense amplifiers $SA_1$-$SA_N$ are enabled. Since the sense nodes $S_1$, $\overline{S_1}$-$S_N$, $\overline{S_N}$ have a far small capacitance $C_{11}$ as compared to the bit line capacitance $C_{31}$, the small signal difference between the respective sense node pairs are amplified by the sense amplifiers $SA_1$-$SA_N$ at a high speed.

For example, one sense node $S_1$, reaches the power source potential Vcc, and the other node $\overline{S_1}$ is discharged to the grounding potential. A column address strobe signal $\overline{CAS}$ falls at a time point $t_5$, and one pair of the column selection transistors, for example, $QY_1$ and $\overline{QY_1}$ are selected on the basis of column address information given from the outside at a time point $t_6$ to be conductive by the active level of $YSW_1$. Consequently, the data at the sense nodes $S_1'$, $\overline{S_1}'$ are transferred to the pair of common data lines I/O, $\overline{I/O}$, and outputted to the output terminal $D_{out}$ through an output circuit 11, at a time point $t_7$. At this point in time, the electric potential of the transfer gate control signal TG remains low, and the bit lines $D_1$, $\overline{D_1}$-$D_N$, $\overline{D_N}$ have not yet been amplified.

Then, at a time point $t_8$, $\overline{RAS}$ and $\overline{CAS}$ are rendered inactive (high level) so that the reset period TB is introduced to the memory. As a result, the signal $YSW_1$ is changed to the inactive (low) level so that the pair of column selection transistors $QY_1$, $\overline{QY_1}$ are made non-conductive so that the pair of sense nodes $S_1$, $\overline{S_1}$ are isolated from the common data lines I/O, $\overline{I/O}$. Then, at a time point $t_9$, the transfer gate control signal is raised to render the transfer gate transistors $QT_1$, $\overline{QT_1}$-$QT_N$, $\overline{QT_N}$ conductive. As a result, the pairs of bit lines $D_1$, $\overline{D_1}$-$D_N$, $\overline{D_N}$ are electrically connected to the sense amplifiers $SA_1$-$SA_N$ via the pairs of sense nodes $S_1$, $\overline{S_1}$-$S_N$, $\overline{S_N}$, respectively so that the signals on the respective bit lines are amplified by the sense amplifiers $SA_1$-$SA_N$ and the amplified signals are restored into the memory cells coupled to the selected word line (WLi). Thereafter, the control signal RA' is lowered to fall the potential of the selected word line WLi. At this time, the restoring of the memory cells is completed. Also, the control signals SEN' and SEP' are made at their inactive level (low level and high level), respectively and thereafter, the precharge control signal $\phi_p'$ is changed to the active (high) level at a time point $t_{10}$ so that the transistors $QR_1$-$QR_N$ are made conductive. As a result, the pairs of bit lines and the pairs of sense nodes are set to the precharge level of approximately $\frac{1}{2}$ Vcc to complete the reset operation.

According to the present embodiment, the amplified state of the selected sense nodes $S_1$, $\overline{S_1}$ are electrically connected under the isolation of the bit lines $D_1$, $\overline{D_1}$ from the sense nodes $S_1$, $\overline{S_1}$, the read-out signal can be outputted to the terminal $D_{out}$ before the restoring of the stored data at a high speed as indicated by an arrow A in FIG. 4. Moreover, the restoring of data to the memory cells is conducted during the reset period $T_B$ as illustrated by an arrow B after the active period $T_A$. Therefore, the effective length of the active period $T_A$ is shortened as viewed from the outside. Thus, a high speed operation can be attained.

An example of the timing signal generator 30 in FIG. 3 will be explained with reference to FIGS. 5 and 6.

Figure 5:
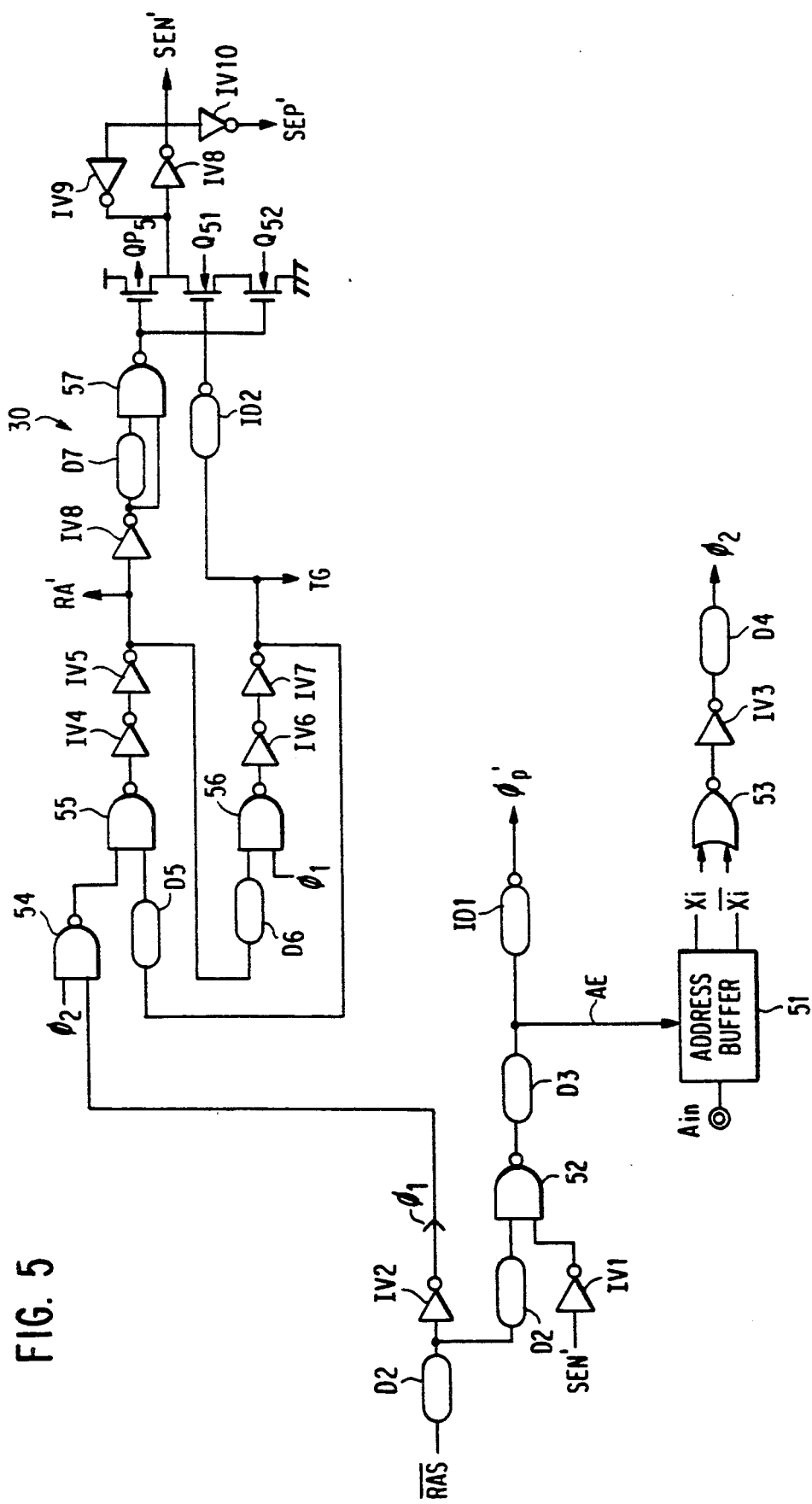
FIG. 5 is a schematic block diagram of a timing signal generator employed in the memory of FIG. 3.

As shown in FIG. 5, the timing signal generator 30 includes delay circuits D1 to D7, inverting delay circuits $ID_1$ and $ID_2$, inverter circuits $IV_1$ to $IV_{10}$, a dummy address buffer 51, NAND gates 52, 54, 55, 56 and 57, a NOR gate 53, and a series circuit of a P-channel MOS transistor $QP_5$ and N-channel MOS transistors $Q_{51}$, $Q_{52}$.

An internal signal $\phi_1$ is generated from $\overline{RAS}$ through the delay circuit $D_1$ and the inverter $IV_2$ and has the substantially opposite phase to $\overline{RAS}$. A control signal AE which is used to enable row address buffers (not shown in FIG. 3), is generated from the delay circuit $D_3$. The dummy row address buffer 51 receives one of row address signal $A_i$ and generates it true and complementary buffered address signals $X_i$, $\overline{X_i}$ when enabled by AE. The buffered address signals $X_i$, $\overline{X_i}$ are applied to the NOR gate 53, the inverter $IV_3$ and the delay circuit $D_4$ in cascade and, an internal signal $\phi_2$ is generated from the delay circuit $D_4$. The signal $\phi_2$ is generated when the states of $X_i$ and $\overline{X_i}$ are established. The internal signals $\phi_1$ and $\phi_2$ are applied to the NAND gate 54 for generation of RA' and TG, as illustrated.

Figure 6:
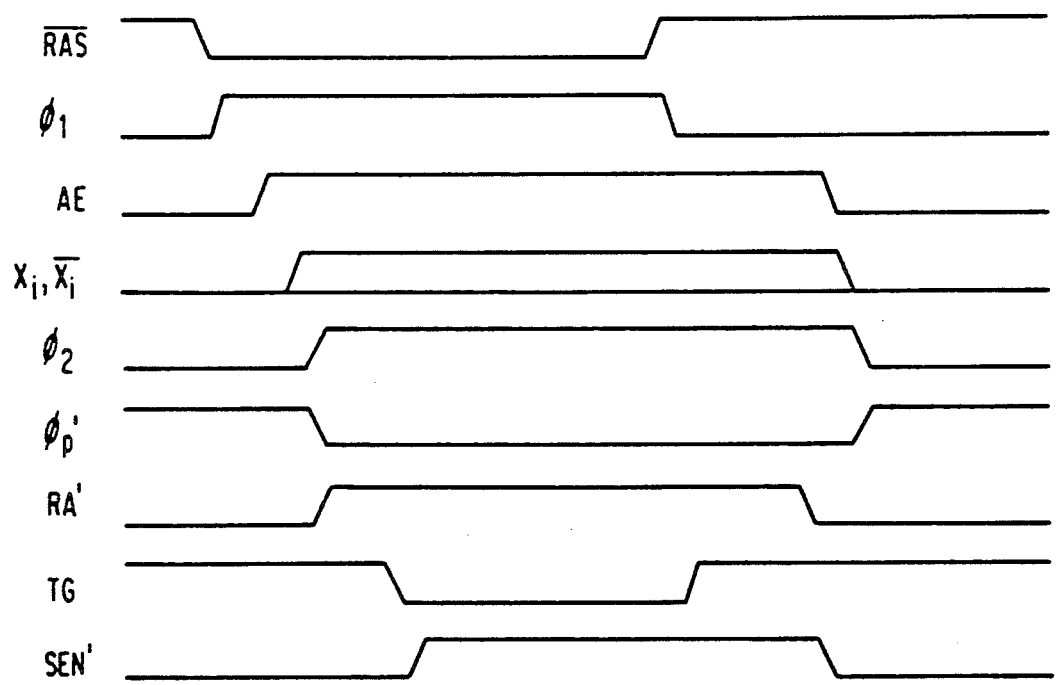
FIG. 6 is a timing diagram showing waveforms of signals in the timing signal generator of FIG. 5.

Internal waveforms of the respective signals are shown in FIG. 6.

Figure 7:
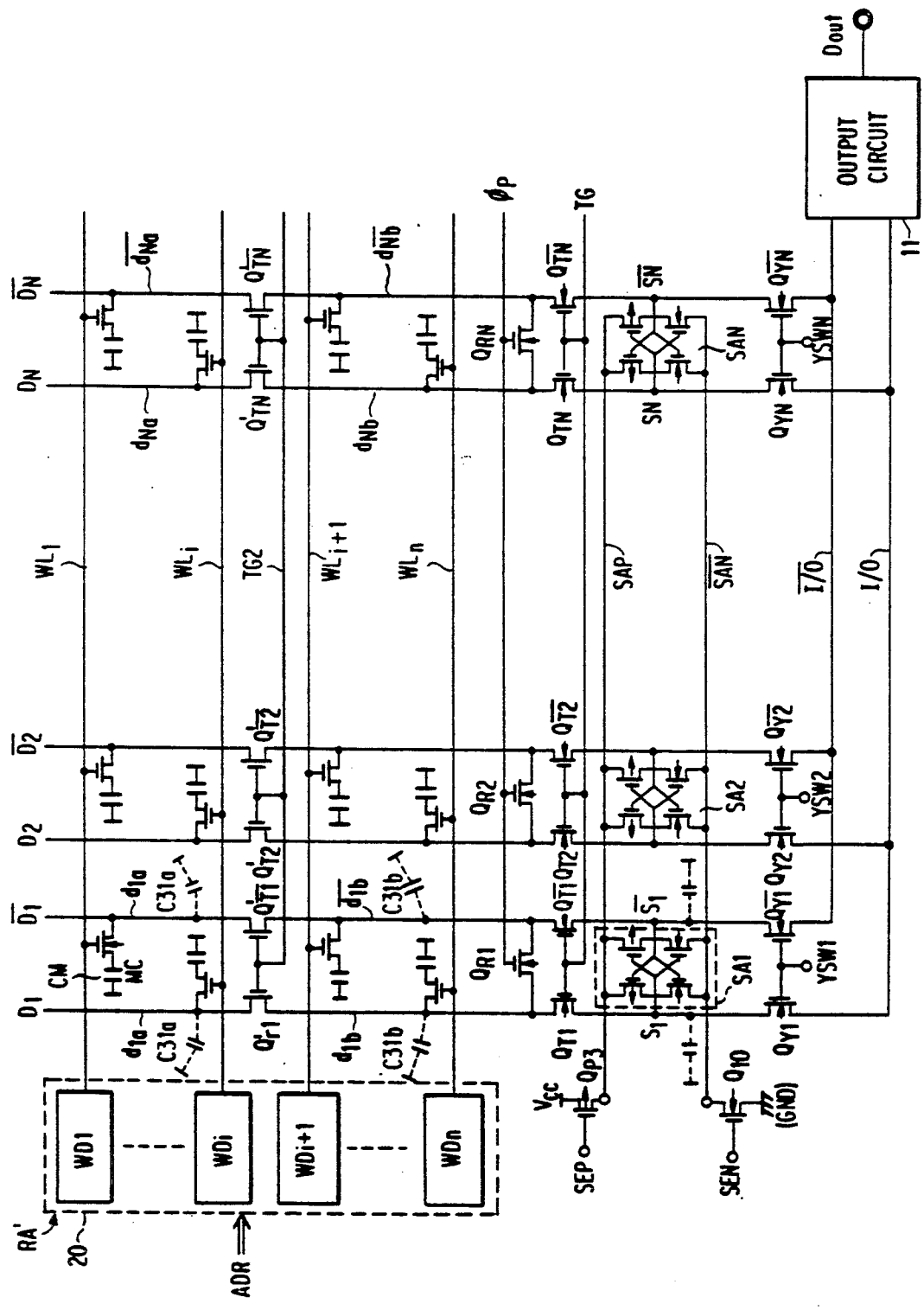
FIG. 7 is a schematic circuit diagram of a dynamic memory according to a second embodiment of the present invention.
Figure 8:
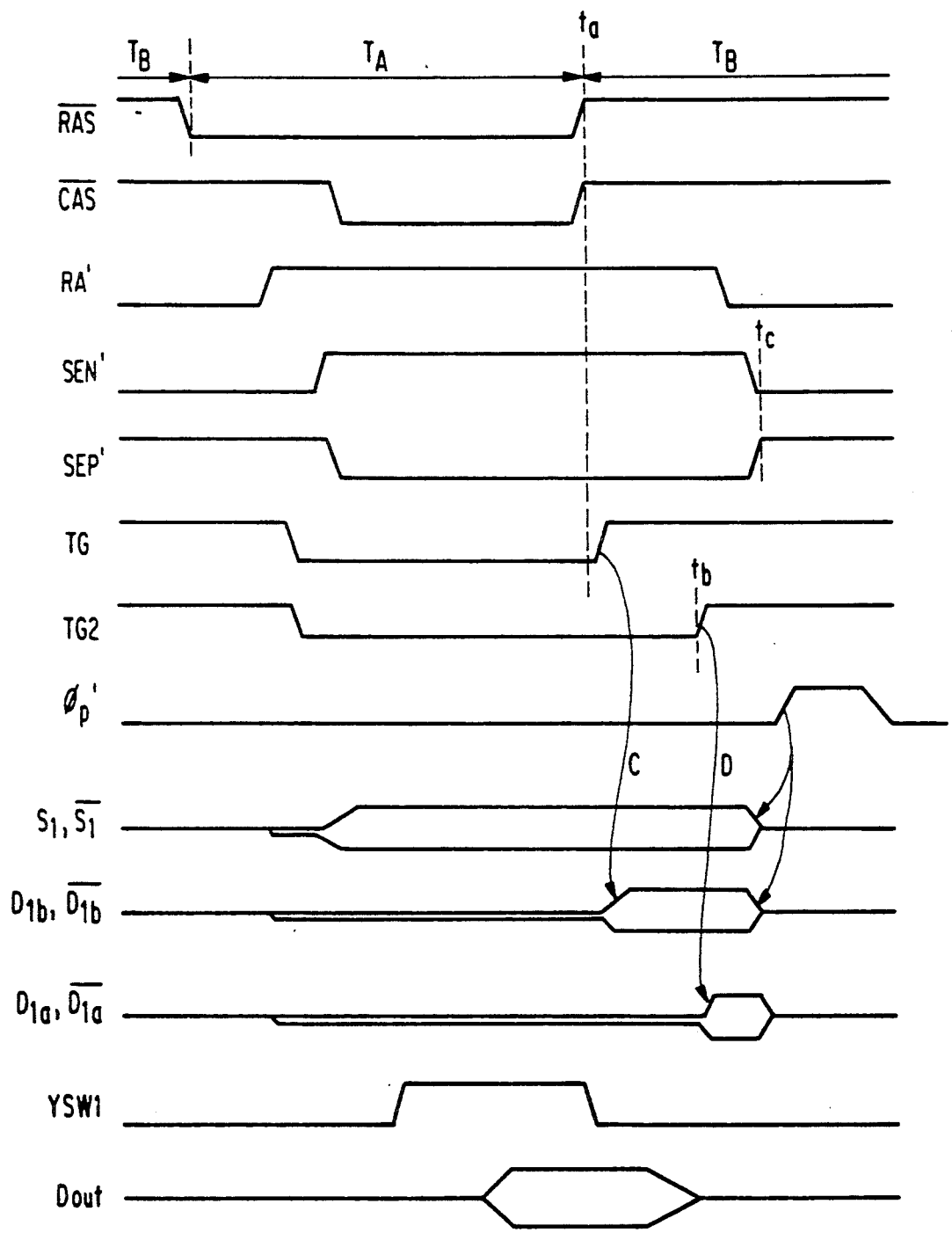
FIG. 8 is a timing diagram showing an operation of the memory of FIG. 7.

With reference to FIGS. 7 and 8, the memory according to a second embodiment of the present invention will be explained. The present embodiment is featured in that the pairs of bit lines $D_1$, $\overline{D_1}$-$D_N$, $\overline{D_N}$ are physically divided into pairs of first bit line segments $d_{1a}$, $\overline{d_{1a}}$-$d_{Na}$, $\overline{d_{Na}}$ and pairs of second bit line segments $d_{1b}$, $\overline{d_{1b}}$-$d_{Nb}$, $\overline{d_{Nb}}$, respectively and a plurality pairs of second transfer gate transistors $Q'_{T1}$, $\overline{Q'_{T1}}$-$Q'_{TN}$, $\overline{Q'_{TN}}$ are inserted between the pairs of first bit line segments $d_{1a}$, $\overline{d_{1a}}$-$d_{Na}$, $\overline{d_{Na}}$ and the pairs of second bit line segments $d_{1b}$, $d_{1b}$-$d_{Nb}$, $d_{Nb}$, respectively. The second transfer gate transistors $Q'_{T1}$, $\overline{Q'_{T1}}$-$Q'_{TN}$, $\overline{Q'_{TN}}$ are controlled by a second transfer gate control signal $TG_2$. The control signal $TG_2$ is such a signal that falls in potential in synchronism with the fall of TG and rises after the rise of $TG_2$, as illustrated in FIG. 8. The operation of this embodiment is substantially the same as the embodiment of FIG. 3 except following points. Namely, until a time point $t_a$, the active period is introduced to the memory and data at the sense nodes $S_1$, $\overline{S_1}$ are outputted as $D_{out}$. At the time point $T_a$, $\overline{RAS}$ is made inactive so that the reset period is introduced to the memory. Then, the signal TG is raised to make the transfer gate transistors $QT_1$, $\overline{QT_1}$-$QT_N$, $\overline{QT_N}$ conductive so that the second bit line segments $\overline{d_{1b}}$, $d_{1b}$-$d_{Nb}$, $\overline{d_{Nb}}$ are electrically connected to the sense amplifiers $SA_1$-$SA_N$, respectively. Thus, the levels of the second bit line segments are amplified so that the data read out of the memory cells connected thereto are restored as illustrated by an arrow C in FIG. 8. Then, at a time point $t_b$, the control signal $TG_2$ is raised to make the second transfer gate transistors $Q'_{T1}$, $\overline{Q'_{T1}}$-$Q'_{TN}$, $\overline{Q'_{TN}}$ conductive. As a result, the first bit line segments $d_{1b}$, $\overline{d_{1b}}$-$d_{Nb}$, $\overline{d_{Nb}}$ are electrically connected to the sense amplifiers $SA_1$-$SA_N$ via the second bit line segments $d_{1a}$, $\overline{d_{1a}}$-$d_{Na}$, $\overline{d_{Na}}$, respectively. Thus, the levels of the first bit line segments are amplified so that the data read out of the memory cells connected thereto are restored, as illustrated by an arrow D. Then, at a time $t_c$, the signals SEN' and SEP' are made inactive and the precharge control signal $\phi_p'$ is rendered active. As a result, the restoring operation is completed and the reset of the bit line segments and sense amplifiers are started.

According to this embodiment, the bit lines are divided, and the electric charging and discharging are done in a time-divided manner during a refreshing operation, so that the occurrence of noise during such an operation can be prevented.

According to the present invention described above, the information in the memory cell is transmitted to the sense nodes during an active period, and the sense nodes and bit lines are thereafter left separated from each other. The restoring of the information in the memory cell is done during a reset period. Thus the increasing of the speed of the operations of the sense amplifiers and the reduction of the access time can be achieved. Moreover, it is unnecessary to subject the bit lines having a large stray capacitance to the electric charging and discharging in one period, and the complete separation with respect to time can be effected. Accordingly, the minimization of noise occurring between the bit lines and the reduction of peak current can be attained effectively with ease.

Since the charging and discharging of the bit lines having a comparatively large stray capacitance are carried out during a precharge period, it is unnecessary to determine the input level of an external signal, such as an address signal, and the occurrence of a decrease of the power source potential and the floating of the grounding potential, which cause an erroneous operation of the memory to occur, can be greatly reduced.

I claim:

1. A semiconductor memory circuit comprising a plurality of dynamic type memory cells which necessitate restoring of read-out data for continuing storage of data, means for receiving an external control signal having an active level from a first time point to a second time point after said first time point and an inactive level after said second time point, the inactive level of said external control signal continuing until at least a third time point, said second and third time points occurring in that order, means for operatively reading data from a selected memory cell without restoring read-out data thereto in response to the active level of said external control signal from said first time point to said second time point, means for detecting a change in said external control signal from the active level to the inactive level to produce a detection signal, and means for operatively restoring the data read from said selected memory cell into said selected memory cell from said second time point to said third time point, in response to said detection signal.

2. The memory circuit according to claim 1, in which each of said memory cells includes a capacitor and a field effect transistor.

3. The memory circuit according to claim 1, wherein the inactive level of said external control signal further continues until at least a fourth time point after said third time point, and said memory circuit further comprising means for resetting said reading from said third time point to said fourth time point.

4. The memory circuit according to claim 1, further comprising bit lines connected to said memory cells, a plurality of sense amplifiers connected to the bit lines, and transfer gates connected between said bit lines and said sense amplifiers.

5. A semiconductor memory circuit comprising a plurality of dynamic type memory cells arranged in rows and columns, a plurality of pairs of bit lines arranged in columns, a plurality of word lines arranged in rows, a plurality of sense amplifiers each having a pair of sense nodes, a plurality of pairs of first transfer gates connected between said pairs of bit liens and the pairs of sense nodes, means for receiving an external control signal which assumes an active level from a first time point to a fifth time point through a second time point, a third time point and a fourth time point and an inactive level after said fifth time point, the inactive level of said external control signal continuing beyond a seventh time point through a sixth time point, said first, second, third, fourth, fifth, sixth and seventh time points occurring in that order, means for operatively selecting one of said word lines, first control means responsive to said external control signal for enabling said selecting means from said second time point to said seventh time point, second control means responsive to said external control signal for enabling said first transfer gates until said third time point occurs and disabling said first transfer gates from said third time point to said sixth time point and thereafter enabling said first transfer gates from said sixth time point beyond said seventh time point, and third control means responsive to said external control signal for enabling said sense amplifiers from said fourth time point beyond said seventh time point.

6. The memory circuit according to claim 5, in which each of said memory cells includes a capacitor and a field effect transistor connected between said capacitor and one of said bit lines.

7. The memory circuit according to claim 6, further comprising a pair of common data lines, a plurality of pairs of second transfer gates connected between said pairs of sense nodes of said sense amplifiers and said pair of common data lines, and means for operatively selecting one pair of said second transfer gates.

8. The memory circuit according to claim 6, in which each of said bit lines is divided into first and second portions physically isolated from each other and a third transfer gate is connected between the first and second portions of the same bit line.

9. The memory circuit according to claim 5, wherein said sense amplifiers are disabled at an eighth time point after said seventh time point, and said memory circuit further comprising means for resetting said selecting means from said seventh time point beyond said eighth time point.

10. A semiconductor memory circuit comprising a plurality of dynamic type memory cells which necessitate restoring of read-out data for continuing storage of data, a plurality of bit lines provided for said memory cells, means for receiving an external control signal having an active level and an inactive level, means for operatively reading data from a selected memory cell without restoring of read-out data thereto and without amplifying a data signal on any one of said bit lines while said control signal assumes the active level, and means for operatively amplifying the data signals on said bit lines and restoring the read-out data from the selected memory cell to said selected memory cell for a predetermined period after change in said control signal from the active level to the inactivated level.

11. The memory circuit according to claim 10, further comprising means for resetting said reading means when said predetermined period has elapsed and said control signal is still at the inactive level.

12. A semiconductor memory circuit comprising a plurality of dynamic type memory cells arranged in rows and columns, a plurality of pairs of bit lines arranged in columns, a plurality of word lines arranged in rows, a plurality of sense amplifiers each having a pair of sense nodes, a plurality of pairs of transfer gates each pair connected between the associated one of said pairs of bit lines and the pair of sense nodes of the associated one of said sense amplifiers, a plurality of pairs of column selection gates each pair connected directly to the pair of sense nodes of the associated one of said sense amplifiers to provide permanent electrical paths therebetween, a pair of data lines connected in common to said pairs of column selection gates, means for receiving an external control signal having an active level and an inactive level, means responsive to the active level of said external control signal for selecting one of said word lines to read out data from the memory cells coupled to the selected word line, each of the data read out of the memory cells providing a potential difference between the associated one of said pairs of bit lines and said potential difference being transferred to the pair of sense nodes of the associated one said sense amplifiers through the associated one of said pairs of transfer gates, means for deactivating said pairs of transfer gates to electrically disconnect said sense amplifiers from said pairs of bit lines after said potential difference is transferred to the pair of sense nodes of the associated sense amplifier, means for activating said sense amplifiers to allow each sense amplifier to amplify said potential difference between the pair of sense nodes thereof to produce information data while said pairs of transfer gates are being deactivated, said information data corresponding to the read-out data from the associated one of the memory cells coupled to said selected word line, means for activating one of said pairs of column selection gates to allow the activated pair of column selection gates to transfer the associated information data onto said pair of data lines, and means responsive to a change of said external control signal from the active level to the inactive level for activating said transfer gates to allow each of said sense amplifiers to amplify the potential difference between the associated one of said pairs of bit lines and restore the data into the associated one of the memory cells coupled to said selected word lines.

13. The memory circuit according to claim 12, further comprising means for deactivating said sense amplifiers after the data are restored into the memory cells and means for precharging said pairs of bit lines to a predetermined level when said external control signal is at the active level and said pairs of transfer gates are activated.

* * * * *